United States Patent
Shigemoto et al.

[11] Patent Number: 6,151,204
[45] Date of Patent: Nov. 21, 2000

[54] ELECTRONIC DEVICE

[75] Inventors: Hiroya Shigemoto; Yukio Ono, both of Tokyo, Japan

[73] Assignee: Taiyo Yuden Co., Ltd., Tokyo, Japan

[21] Appl. No.: 09/298,706

[22] Filed: Apr. 23, 1999

Related U.S. Application Data

[62] Division of application No. 09/183,211, Oct. 30, 1998, Pat. No. 6,071,800.

[30]     Foreign Application Priority Data

Dec. 8, 1997 [JP] Japan ................................. 9-356268

[51] Int. Cl.$^7$ ............................. H01G 4/008; H01G 4/30; H01G 2/20
[52] U.S. Cl. ................... 361/305; 361/301.4; 361/308.1; 361/309
[58] Field of Search ................................... 361/303, 305, 361/306.1, 308.1, 306.3, 309, 301.4

[56]             References Cited

U.S. PATENT DOCUMENTS

| | | | |
|---|---|---|---|
| 4,604,676 | 8/1986 | Senda et al. | 361/321.2 |
| 4,607,314 | 8/1986 | Wada et al. | 361/303 |
| 4,811,162 | 3/1989 | Maher et al. | 361/308.1 |
| 5,144,523 | 9/1992 | Pageaud et al. | 361/308.1 |
| 5,162,973 | 11/1992 | Miyahita et al. | 361/308.1 |
| 5,345,361 | 9/1994 | Billotte et al. | 361/303 |
| 5,426,560 | 6/1995 | Amaya et al. | 361/308.1 |
| 5,712,758 | 1/1998 | Amano et al. | 361/321.2 |
| 5,805,409 | 9/1998 | Takahara et al. | 361/303 |
| 6,043,973 | 3/2000 | Nagashima et al. | 361/305 |

*Primary Examiner*—Kristine Kincaid
*Assistant Examiner*—Eric Thomas
*Attorney, Agent, or Firm*—Flynn, Thiel, Boutell & Tanis, P.C.

[57]             ABSTRACT

An electronic device has an element assembly, in which electronic parts elements are disposed, and external electrodes of metal film which are formed on surfaces of the element assembly of the electronic device so as to extend and connect to the electronic parts elements, respectively. Further, in this electronic device, the external electrode is made up of an anchor layer adhered on the surface of the element assembly of the electronic device, a solder-resist layer formed to cover the anchor layer, and a solder-wettable layer formed to cover a surface of the solder-resistant layer and showing a superior wettability with respect to molten solder, in which the external electrode further includes an intermediate layer provided between the solder-resistant layer and the solder-wettable layer and made of an alloy containing both metal materials forming the solder-resistant layer and the solder-wettable layer.

6 Claims, 4 Drawing Sheets

ELECTRONIC DEVICE

This is a division of Ser. No. 09/183,211, filed Oct. 30, 1998 now U.S. Pat. No. 6,071,800.

BACKGROUND OF THE INVENTION

1. Field of the Invention

The present invention relates to an electronic device, such as a laminated ceramic capacitor and a laminated ceramic inductor or the like, and a manufacturing method thereof, and in particular, to a chip-like shaped electronic device and a manufacturing method thereof, which has an improved structure in external electrodes of conductive films which are formed on surfaces of an element assembly (a bare or naked chip body) of the electronic device and improved in the formation thereof.

2. Description of Related Art

As an electronic device of the laminated type, a laminated ceramic capacitor and a laminated ceramic inductor are representative, however, there are many other compound elements, such as a LC device which combines those devices together.

With a laminated ceramic capacitor being a representative example of the laminated electronic device, a large number of internal electrodes in the form of a layer are laminated or piled up through ceramic layers, constitute circuit elements of the electronic device as a capacitor, and also extend to end surfaces of the element assembly of the electronic device. On the end surfaces of the element assembly of the electronic device, onto which the internal electrodes are extended, external electrodes of conductive film are formed.

In a general method for manufacturing the laminated ceramic capacitor, as an example thereof, a ceramic slurry of dielectric ceramic powder which is dispersed in an organic binder is formed into a shape of a sheet so as to form a ceramic green sheet, and on that ceramic green sheet is printed a pattern(s) of the internal electrodes of a conductive paste by a screen printing method, or the like. Then, the ceramic green sheets, on each of which is printed the internal electrode pattern(s), are piled up, and further at both sides of it are also piled up a plurality of the ceramic green sheets on which no internal electrode pattern is printed. The element assembly which is obtained in this manner is cut into a chip-like shape, thereby exposing the internal electrodes at the end surfaces thereof, and is baked. Then, on the end portions of the baked element assembly of the electronic device is pasted the conductive paste to form the external electrodes being baked thereafter, thereby completing the laminated chip capacitor.

Further, in another manufacturing method of the capacitor of the laminated ceramic type, before baking the ceramic element assembly of the electronic device, the conductive paste is applied on the end portions thereof in advance, and thereafter, the ceramic element assembly of the electronic device, as well as the applied conductive paste are baked, simultaneously. Furthermore, as the method for obtaining the element assembly of such an electronic device, there is also employed a so-called slurry built method, in which the ceramic paste and the conductive paste are painted one by one, other than the so-called sheet method using the ceramic green sheet.

For such electronic devices, including the laminated ceramic capacitor as a representative one thereof, there are the requirements of a large capacitance or high inductance and so on, while reducing the size thereof.

FIG. 3 shows an example of such the laminated ceramic capacitor. Inside of the element assembly 1 of the electronic device, i.e., a laminated body of ceramic layers 2, there are provided two (2) sets of the internal electrodes 3, 4 opposing each other mutually, and two (2) sets of the internal electrodes 3, 4 extend outside to the end surfaces of the element assembly 1 of the electronic device, which surfaces oppose each other. Upon both end portions of the element assembly 1 of the electronic device are formed the external electrodes 5, 5 of the conductive film, and those external electrodes 5, 5 are electrically connected to the two (2) sets of the internal electrodes 3, 4, respectively.

The chip-like shaped electronic device, represented by the laminated ceramic capacitor, is mounted on a circuit board or the like, and the external electrodes thereof are connected by soldering. At this instance, for the external electrodes, there are required a good solderability, a strong mechanical shear strength (bonding or adhesion strength) after soldering, and a good electrical conductivity. Therefore, the external electrodes 5, 5 are constructed of a plurality of metal layers, not just a single layer.

FIG. 4 shows the metal layers of the external electrodes 5, 5. First of all, upon the surface of the element assembly 1 of the electronic device, an anchor layer 6 is formed, which layer shows a good bonding or adhesion property upon the surface of the element assembly 1 and a good electrical conductivity with the internal electrodes 3, 4 (see FIG. 3). Upon the anchor layer 6, there is formed a solder-resistant layer 7 that shows a property against a so-called bitten by solder, i.e., the metal particles of a metal layer is reluctant to flow out into the melting solder. Furthermore, upon the solder-resistant layer 7, there is formed a solder-wettable layer 9 which has a good wettability with the molten solder.

As a means for forming the above-mentioned external electrodes 5, 5, there are known two types of methods, such as a wet process and a dry process, roughly classifying them.

With the wet process, the external electrodes 5, 5 are formed by means of printing and baking of the conductive paste or plating, and so on. In this wet process, in general, the mentioned anchor layer 6 is formed of a printed layer of Ag and the solder-resistant 7 of a plated layer of Ni, and further, the solder-wettable layer 9 of a plated layer of solder.

With the dry process, the external electrodes 5, 5 are made by forming the conductive film on the end portions of the element assembly 1 of the electronic device, by means of a vacuum evaporation or sputtering and so on. With this dry process, in general, the above-mentioned anchor layer 6 is formed of a film of Cr or a Cr alloy, the solder-resistant layer 7 of a film of Ni or Ni alloy, and further, the solder-wettable layer 9 is formed of a film of Ag, Sn or a Sn alloy.

In the wet process of the former, however, there are drawbacks that the external electrodes 5, 5 are difficult to form with a high accuracy because of the narrow pitches thereof, and further, the reliability is reduced since a plating liquid enters into the inside of the element assembly 1 of the electronic device during the plating thereof. Therefore, currently, the dry process is prevailing gradually.

However, when the external electrodes are formed by the dry process mentioned above, the bonding property between the solder-resistant layer 7 and the solder-wettable layer 9 is not so good, thereby, there is another drawback that the boundary surface between the solder-resistant layer 7 and the solder-wettable layer 9 is easily exfoliated or peeled in a test of the shear strength thereof.

Further, when the solder-wettable layer 9 is formed out of a metal material having a low melting or fusing point, such as Sn or solder, if the metal forming the solder-wettable layer 9 is sparse or non-dense, spottedly, the melting solder does not expand over the surfaces of the external electrodes 5, 5, when soldering. Under such a condition, the solder not only shows a bad wettability but also water or moisture within the air enters into the inside of the element assembly 1 of the electronic device, thereby causing the corrosion of the conductive body in its inside and also the short-circuiting thereof.

SUMMARY OF THE INVENTION

An object according to the present invention is, for overcoming the drawbacks in the conventional electronic device mentioned above, to provide an electronic device having external electrodes, wherein the external electrodes are protected from being solder-bitten with certainty, while maintaining a high shear strength when being soldered, and also showing good wettability with the solder.

In particular, the present invention is preferable or suitable to form the external electrodes with the dry process.

According to the present invention, for accomplishing the object mentioned above, there is provided an electronic device, having a solder-resistant layer formed on an anchor layer which is adhered on a surface of an element assembly of the electronic device, and a solder-wettable layer which is formed to cover a surface of said solder-resistant layer and shows a superior wettability with molten solder, and between said solder-resistant layer and said solder-wettable layer is formed an intermediate layer made of an alloy which contains both metal materials forming said solder-resistant layer and said solder-wettable layer, thereby obtaining reinforcement in the bonding strength between the solder-resistant layer and the solder-wettable layer.

The electronic device comprises the element assembly of the electronic device in which the electronic part elements are disposed, and external electrodes of metal film which are formed on surfaces of said element assembly of the electronic device so as to be extended and connected to said electronic parts elements, respectively. Further, in the electronic device, the external electrode comprises an anchor layer adhered on the surface of said element assembly of the electronic device; a solder-resistant layer formed to cover said anchor layer; and a solder-wettable layer formed to cover a surface of said solder-resistant layer and showing a superior wettability with molten solder; and further comprises an intermediate layer provided between said solder-resistant layer and said solder-wettable layer and made of an alloy which contains both metal materials forming said solder-resistant layer and said solder-wettable layer.

In this electronic device, since there is provided an intermediate layer made of an alloy containing both the metal materials of the solder-resistant layer and the solder-wettable layer, the solder-resistant layer and the solder-wettable layer are bonded through the intermediate layer, thereby being strengthened in the shear strength therebetween. Accordingly, it is possible to strengthen the shear strength when the external electrode is being soldered. Further, by providing the intermediate layer on the solder-resistant layer which shows a bad wettability with the molten solder, since the intermediate layer functions as a groundwork or foundation for the solder-wettable layer, the solder-wettability upon the surface of the external electrode comes to be good or satisfactory, compared to a case where the solder-wettable layer is provided directly on the solder-resistant layer.

Since the bonding or adhesion strength between the solder layer and the solder-wettable layer tends to be weak, in particular, with the external electrode which is formed with the dry process, the increase in the shear strength when being soldered is remarkable by provision of the intermediate layer.

The anchor layer is, in general, made of a film of Cr or an alloy containing Cr, and the solder-resistant layer of Ni or an alloy containing Ni. Further, by forming the anchor layer with an alloy film containing Cr and Ni, the anchor layer can be used in common with the solder-resistant layer. Further, the solder-wettable layer is generally made of Sn or an alloy containing Sn. Accordingly, in this case, the intermediate layer laid between the solder-resistant layer and the solder-wettable layer is made of an alloy film containing Ni and Sn. For this intermediate layer, it is preferable to contain a crystal of the alloy having a diameter equal to or less than 1.5 $\mu$m, and the finer the diameter of the metal particle, the stronger the shear strength between the solder-resistant layer and the solder-wettable layer.

However, the higher the composition ratio of Sn in the Sn—Ni alloy of the intermediate layer, functioning as the foundation of the solder-wettable layer, the better the solder-wettability upon the surface of the external electrode.

The external electrode mentioned above is formed by forming the anchor layer on the surface of the element assembly of the electronic device, forming the solder-resistant layer to cover the anchor layer, forming the intermediate layer to cover the solder-resistant layer, and further forming the solder-wettable layer to cover the intermediate layer, in sequence, by means of vacuum evaporating or sputtering.

In this instance, by forming the anchor layer, the solder-resistant layer, the intermediate layer and the solder wettable layer, sequentially, in a vacuum chamber, without bringing the pressure within the chamber to an atmospheric pressure, a preferable working efficiency is obtained, as well as an external electrodes of high bonding strength. Further, by adhering the metal molecules or the atoms of the metal which forms the solder-wettable layer upon the solder-resistant layer which the external electrode comprises, it is also possible to form the intermediate layer made of the alloy containing both the metal materials, each forming the solder-resistant layer and the solder-wettable layer, respectively, as well as the solder-wettable layer on it, continuously.

In this manner, according to the present invention, it is possible to obtain an electronic device having a good wettability with solder when soldering the external electrode thereof, no solder-bitten occurs, i.e., no metal components of the external electrode flows out into the molten solder, while obtaining a good bonding strength after the soldering. In particular, even with the external electrode being formed by the dry process, which has the drawback of weakness in the bonding strength under a condition of being soldered in the conventional art, it is possible to obtain a strong strength in the bonding or adhesion property. Thereby, it is possible to improve the reliability of the electronic device, in particular, when it is mounted on the circuit board.

DESCRIPTION OF THE PREFERRED EMBODIMENTS

Figure 1:
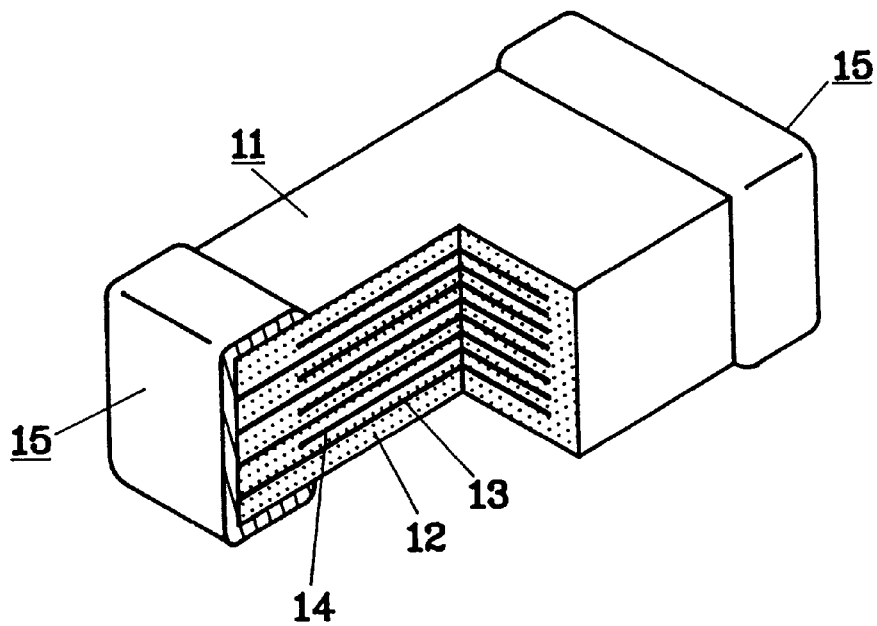
FIG. 1 shows a perspective view including a partial vertical cross-section of a laminated ceramic capacitor, as one example of an electronic device according to the present invention.

Hereinafter, detailed explanation of the embodiments according to the present invention will be given by referring to the drawings.

FIG. 1 shows a laminated ceramic capacitor as an example of an electronic device having external electrodes 15, 15. As mentioned previously, in the laminated ceramic capacitor, through ceramic layers 12 contain internal electrodes 13, 14 of a film-like shape in a large number thereof, constructing elements of the electronic device or parts, and the internal electrodes 13, 14 extend out to end surfaces of an element assembly 11 (or a naked laminated body of ceramic) of the electronic device. Upon the end surfaces on which those internal electrodes 13, 14 are extended, external electrodes 15, 15 are formed of a conductive film.

Processes for manufacturing the laminated ceramic capacitor, except for processes for forming the external electrodes 15, 15, which will be explained later, is basically the same as the manufacturing method of the laminated ceramic capacitor mentioned above.

Figure 2:
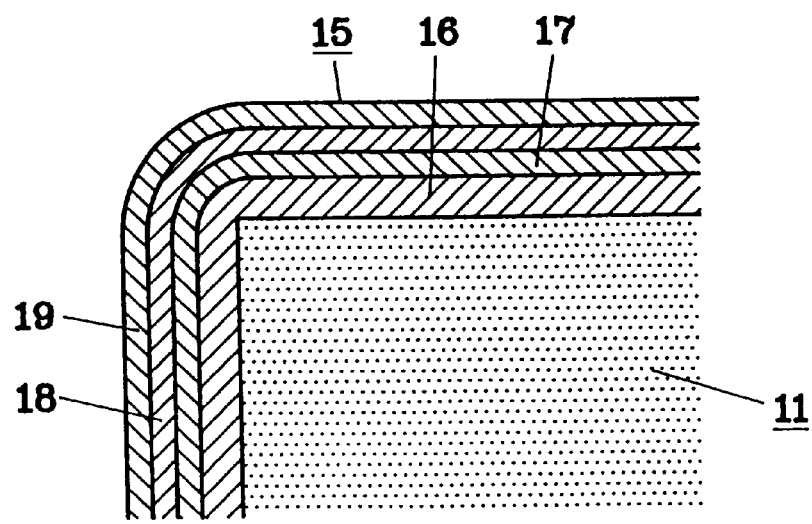
FIG. 2 shows an enlarged cross-section view showing a principle portion, including a laminated structure of external electrodes, of the laminated ceramic capacitor.
Figure 3:
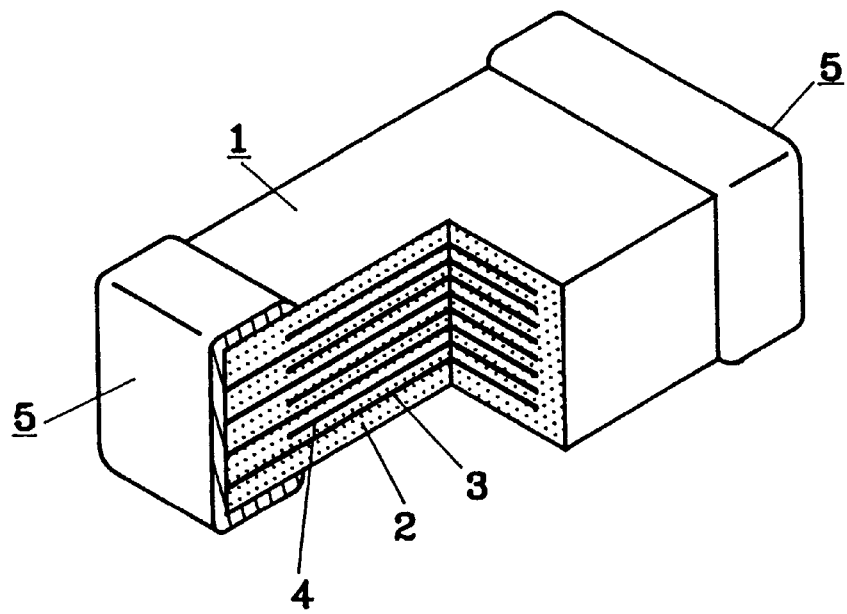
FIG. 3 shows a perspective view including a partial vertical cross-section of a laminated ceramic capacitor, as one example of a conventional electronic device.
Figure 4:
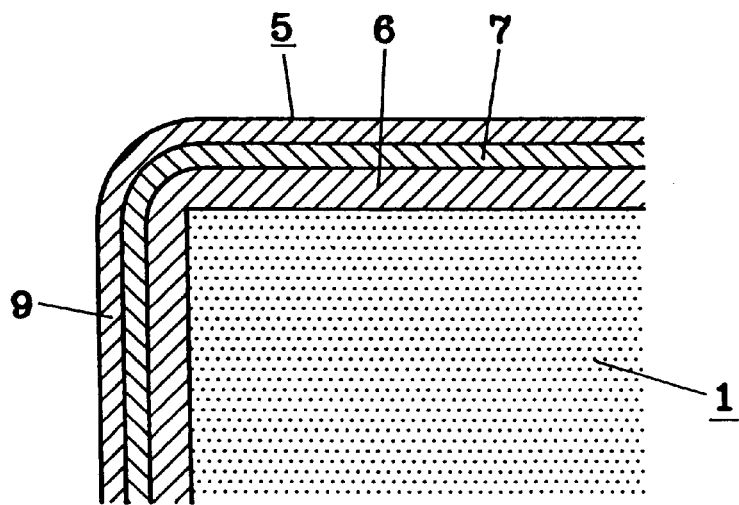
FIG. 4 shows an enlarged cross-section view of showing a principle portion, including a laminated structure of external electrodes, of the conventional laminated ceramic capacitor.

FIG. 2 shows a laminated structure of metal layers of the external electrodes 15, 15. Upon the surface of the element assembly 11 of the electronic device, there is formed an anchor layer 16 which shows a good bonding or adhesion property onto the surface of the element assembly 11 and a good electrical conductivity with the internal electrodes 13, 14 (see FIG. 1). On the surface of the anchor layer 16, there is formed a solder-resistant layer 17 having an anti-solder-bitten property, i.e., made of a metal material, the metal particles or component of which is reluctant to flow out into the molten solder. Further, on the solder-resistant layer 17, an intermediate layer 18 is formed, and on the intermediate layer 18 is formed a solder-wettable layer 19 which shows a good wettability with the molten solder. The intermediate layer 18 is made of an alloy containing both of the metal materials, each of which forms the solder-resistant layer 17 and the intermediate layer 18, respectively.

The anchor layer 16 is made of Cr or an alloy containing Cr mainly, in more detail, with a film of an alloy containing Cr equal to or more than 30 weight %. For the Cr alloy for forming the anchor layer 16, it is preferable to contain Ni therein. The solder-resistant layer 17 is made of Ni or an alloy containing Ni, in more detail, a film of an alloy containing Ni equal to or more than 30 weight %. For the Ni alloy for forming the solder-resistant layer 17, it is preferable to contain at least one of Fe, Cu, and Cr therein. However, by forming the anchor layer 16 with an alloy film containing Cr and Ni, the same anchor layer 16 comes to be usable as the solder-resistant layer 17, in common.

The solder-wettable layer 19 is made of Sn or an alloy containing Sn, in more detail, with a film of an alloy containing Sn equal to or more than 30 weight %. For the Sn alloy for forming the solder-wettable layer 19, it is preferable to contain at least one of Pb, Bi, In, Ag and Zn therein. The intermediate layer 18, laid between the solder-wettable layer 19 and the above-mentioned solder-resistant layer 17, is made of a film of an alloy containing Ni and Sn. The composition ratio between Sn and Ni of the intermediate layer 18 lies preferably within a range from 4:6 to 6:4. Further, it is also preferable for the intermediate layer 18 to contain a crystal of the alloy which is equal to or less than 1.5 $\mu$m in diameter or the particle thereof, and the finer in the diameter of the metal particle of the intermediate layer 18, the more minute the solder-wettable layer 19 on it. In other words, when the metal particle diameter of the intermediate layer 18 is large, the solder-wettable layer 19 on it comes to be sparse or spottedly provided thereon.

The external electrodes 15, 15 are provided by forming the anchor layer 16, the solder-resistant layer 17, the intermediate layer 18 and the solder-wettable layer 19 upon the surface of the element assembly 11 of the electronic device, in sequence, by means of vacuum evaporation or a sputtering method.

In this instance, by forming the anchor layer 16, the solder-resistant layer 17, the intermediate layer 18 and the solder wettable layer 19, sequentially, in a vacuum chamber, without returning the pressure within the chamber to an atmospheric pressure, a preferable working efficiency is obtained, as well as the external electrodes 15, 15 having a high bonding strength. Further, by adhering the metal molecules or the metal atoms of the metal which forms the intermediate layer upon the solder-resistant layer which the external electrode comprises, it is also possible to form the intermediate layer made of the alloy containing both the metal materials, each forming the solder-resistant layer and the solder-wettable layer, respectively, as well as the solder-wettable layer on it, continuously. Further, by adhering the molecules of Sn upon the solder-resistant layer 17 of Ni or an alloy containing Ni mainly, it is also possible to form the intermediate layer 18 of the Ni—Sn alloy and the solder-wettable layer 19 of an alloy containing Sn mainly, continuously.

For that purpose, for instance, after forming the Ni film as the solder-resistant layer 17 of Ni, the Sn film is formed while maintaining the vacuum chamber at a temperature of 120–230° C. After that, the Sn film is formed at the thickness of 1 $\mu$m as the solder-wettable layer 19 by maintaining the temperature in the vacuum chamber lower than that mentioned-above, for example, −100 to 100° C.

Figure 5:
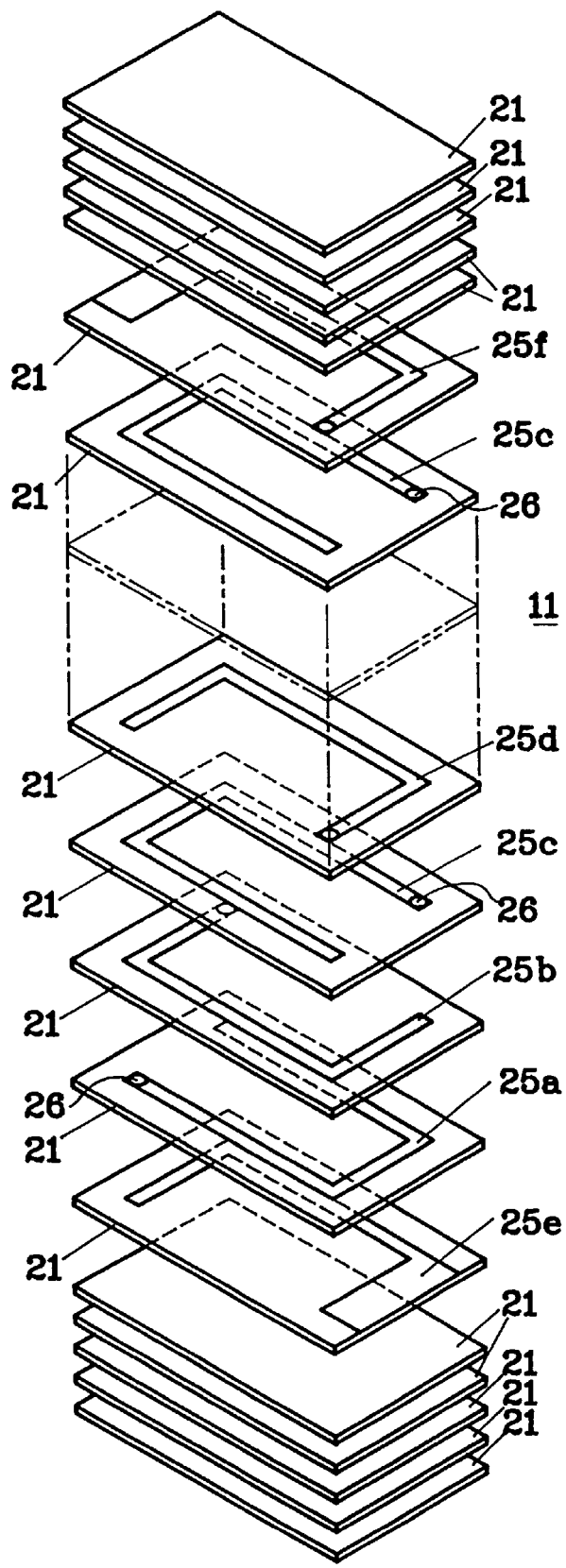
FIG. 5 is an exploded perspective view of showing an element assembly of the electronic device, in particular, of a laminated ceramic inductor.

FIG. 5 is a conception view showing the structure of the element assembly of the electronic device, in particular, of the laminated electronic device of the laminated chip inductor, as another example of the electronic device. The element assembly of the electronic device, in general, is manufactured in a large number thereof, as will be mentioned below, simultaneously.

First of all, thin magnetic ceramic green sheets are made by a so-called doctor blade method or an extrusion molding method with a magnetic slurry, which is prepared by dispersing a powder of a magnetic material, such as a ferrite powder, into a binder. On those ceramic green sheets, through-holes are punched at predetermined positions in advance. Thereafter, with a conductive paste such as silver paste and so on, internal electrode patterns of a spiral shape are printed on the ceramic green sheet, aligned vertically and horizontally in a large number of sets thereof and, at the same time, conductive electrodes are formed by vacuuming the conductive paste through the mentioned through-holes, therein.

An appropriate number of sets of the ceramic green sheets are prepared, having internal electrode patterns different in the shape thereof, depending on the necessary number of turns of a coil or winding, and they are stacked one by one. Then, at both sides of those ceramic green sheets are also stacked the ceramic green sheets on which no internal electrode pattern is printed.

The laminated body of those sheets, after being pressed to be connected to one another, is cut into individual chips, and from this unbaked laminated chip, a baked element assembly 11 of the electronic device can be obtained through a baking process thereof.

With the element assembly 11 of the electronic device obtained in this manner, a plurality of ceramic layers 21, 21 . . . 21, 21 . . . are laminated and are integrated as one body.

On the ceramic layer 11, there are formed the spiral shaped internal electrodes 25a, 25b . . . , thereby constituting an electronic elements such as an inductor. Those internal electrodes 25a, 25b . . . are connected in series through the conductive electrodes provided in the through-holes 26, 26 . . . , thereby being connected in a shape of a coil or winding within the element assembly 11 of the electronic device. The ceramic layers 21, 21 . . . of the magnetic ceramic form a magnetic core of the coil or winding.

Among the ceramic layers 21, 21 . . . having the internal electrodes 25a, 25b . . . , the internal electrodes 25e and 25f, which are formed on the ceramic layers 21 and 21 at an upper end and a lower end thereof in FIG. 5, extend onto a pair of end surfaces of the element assembly 11 of the electronic device, opposing each other.

Further, at both sides of the ceramic layers 21, 21 . . . , on which the above-mentioned internal electrodes 25a, 25b . . . are formed, so-called blank ceramic layers 21, 21 . . . , i.e., the ceramic layers on which no internal electrode is formed, are stacked. With the element assembly 11 of the electronic device shown in FIG. 5, those blank ceramic layers 21, 21 . . . are made out of the same magnetic material as the ceramic layers 21, 21 . . . forming the core of the coil or winding with the internal electrodes 25a, 25b . . . thereof.

Figure 6:
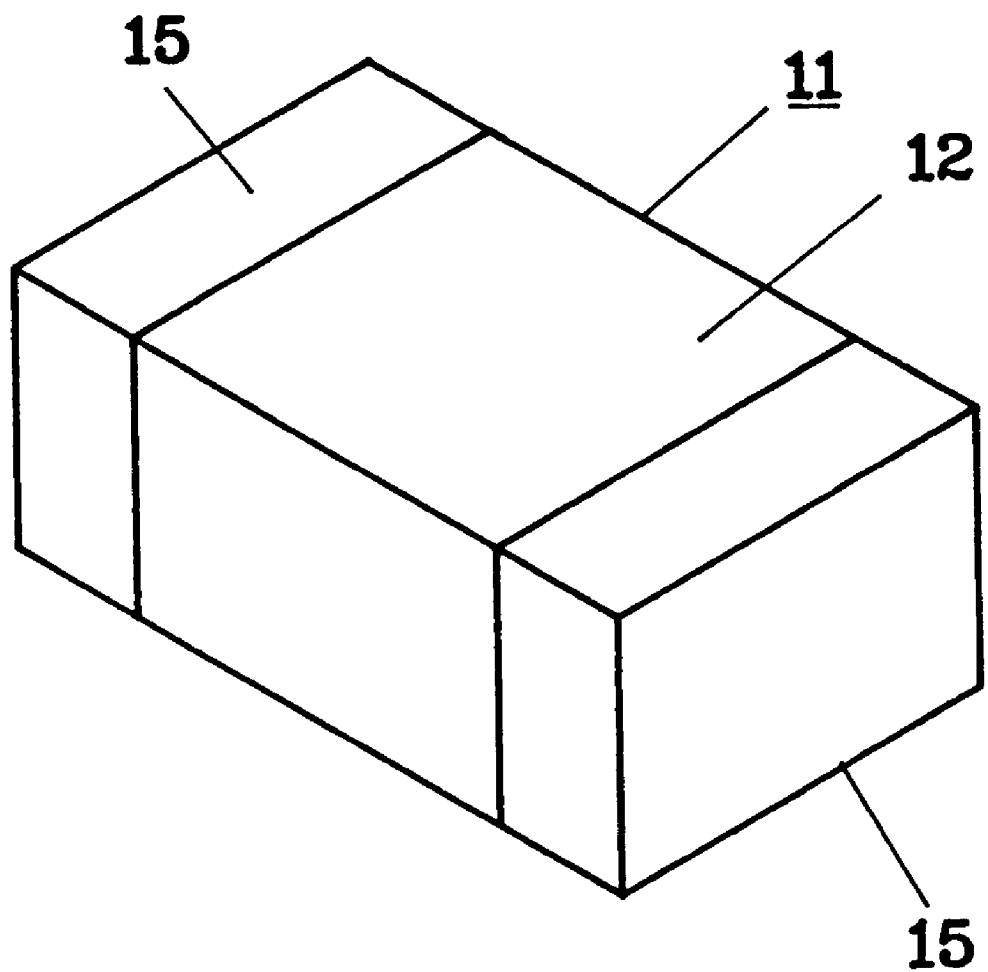
FIG. 6 shows a perspective view of a finished product of the laminated ceramic inductor.

As shown in FIG. 6, at both ends of the element assembly 11 of the electronic device, the external electrodes 15, 15 are formed by a vacuum evaporation method or sputtering method. Those external electrodes 15, 15 are basically the same as those of the laminated ceramic capacitor mentioned previously, and thereafter are made on the anchor layer 16, the solder-resistant layer 17, the intermediate layer 18 and the solder-wettable layer 19, respectively.

However, in the embodiments mentioned above, there are explained only the examples in which a single external electrode 15 is formed at the respective end portions of the element assembly 11 of the electronic device. However, the present invention also can be applied to an electronic device of a so-called alley-type, with which a plurality of external electrodes 15, 15 are provided separately on a side surface of the element assembly 11 thereof. In the alley-type electronic device, in particular, to which the present invention is applied, the effect of increasing the bonding strength is remarkable when the external electrodes 15, 15 are soldered.

Next, an example according to the present invention will be explained by indicating specific values thereof.

(EXAMPLE 1)

The magnetic ceramic powder of the ferrite group, after being baked provisionally, is dispersed into an organic binder, thereby preparing the magnetic slurry. This slurry is formed to be the magnetic ceramic green sheets with the doctor blade method.

After punching the through-holes at the predetermined positions on a portion of those ceramic green sheets, a large number of sets of the spiral-shaped internal electrode patterns are printed with the use of the silver paste, aligned in the vertical and horizontal directions on the ceramic green sheets, as well as the conductive electrodes being printed by vacuuming the silver paste through the through-holes therein.

First, the blank ceramic green sheets on which no internal electrode pattern is printed are stacked, and then the ceramic green sheets having the internal electrode patterns are stacked one by one so that the internal electrode patterns are connected in series through the through-holes, in the shape of a coil or winding. Further, on those ceramic green sheets, the blank green sheets on which no internal electrode pattern is printed are stacked.

The element assembly, after being pressed for connection thereof, is cut into individual chips. From this unbaked laminated chip, after processing for removing the binder therefrom, a baked element assembly 11 of the electronic device can be obtained, having the layer structure shown in FIG. 5. This obtained element assembly 11 of the electronic device has sizes about 1.6 mm×0.8 mm×0.8 mm, and is rectangular in shape thereof.

Next, with the evaporation method, on both ends of the element assembly 11 of the electronic device, the external electrodes 15, 15 are formed by a method which will be mentioned below.

First, the element assembly 11 of the electronic device is set into a masking tool and then they are set into the vacuum chamber in such a manner that portions other than the ends of the element assembly 11 of the electronic device are hidden from an evaporation source thereof. The vacuum chamber is reduced down to about $1.3 \times 10^{-3}$ Pa, and under this condition, an electron beam is generated by an electron gun so that shock heating is caused at the evaporation source received in a melting pot to evaporate it, and then the evaporated metal molecules adhere upon both ends of the element assembly 11 of the electronic device. Melting pots receive various kinds of metals therein as the evaporation source, and they are rotatable by a rotation mechanism thereof. Thereby, the metal to be evaporated can be selected by the rotation of it, by a predetermined angle.

First, a Cr film of thickness 50 nm is formed the anchor layer 16 on both end surfaces of the element assembly 11 of the electronic device, while monitoring the thickness of the film with a crystal vibrator thickness gauge and following this, a Ni film of a thickness of 1 $\mu$m is formed as the solder-resistant layer 17 on it. Next, while keeping the temperature in the vacuum chamber at 150° C., a Sn film of a thickness of 0.5 $\mu$m is formed. After that, while keeping the temperature in the vacuum chamber at 15° C., a Sn film of a thickness of 1 $\mu$m is formed as the solder-wettable layer.

Observing the structure of the external electrodes 15, 15 which are formed in this manner, in the cross-section thereof through an electron microscope, it is confirmed or acknowledged that an intermediate layer 18 is formed between the Ni film as the solder-resistant layer 17 and the Sn film at the surface side as the solder-wettable layer 19, of a Ni—Sn alloy having an average particle diameter of about 0.5 $\mu$m.

A hundred (100) pieces of the electronic devices are picked from a thousand (1,000) pieces thereof at random, which are manufactured in this manner, and they are mounted on a printed circuit board, and are soldered at the external electrodes 15, 15 upon land electrodes on the circuit board with a eutectic solder. With a bond tester of the type 2400 pc by Dage Co., England, a shear strength test is carried out by hooking a metal rod on the electronic device mounted on the circuit board thereby applying a force in a direction parallel to the circuit board under the condition that the circuit board is fixed. The maximum load just before destruction is measured as the bonding strength for the hundred (100) pieces, and an average value is obtained for them.

Further, among the thousand (1,000) pieces of the electronic devices, twenty (20) pieces are picked at random and are put in a testing chamber at a high temperature, humidity and pressure, which is kept at a temperature of 105° C., pressure of 2 atm., and humidity of 100%, for twenty (20) hours. After that, the electronic devices are taken out from the testing chamber and mounted on a printed circuit board, in the same manner as above, and are also soldered at the external electrodes 15, 15 upon land electrodes on the circuit board with a eutectic solder. Then, they are checked to determine whether the external electrodes 15, 15 are covered with the solder completely or not, through visual observation. As a result, all twenty (20) pieces of the electronic devices are classified into good if the external electrodes 15, 15 are covered with the solder completely and into no-good if not.

The test results on the bonding strength and on the solder-wettability are indicated in Table 1 below.

(Comparison 1)

With the samples mentioned above, the same processes are applied except that when forming the Ni film as the solder-resistant layer 7 of the external electrodes 5, however, on the solder-resistant layer 7 is formed the layer of the Sn film within the vacuum chamber, which is kept at a temperature of −110° C.

Observing the structure of those external electrodes 5, 5 in the cross-section thereof, through an optical microscope, no Ni—Sn alloy layer can be confirmed or acknowledged between the Ni film as the solder-resistant layer 7 and the Sn film at the surface side as the solder-wettable layer 9.

With those electronic devices, the shear strength is measured in a similar manner as the example mentioned above and, at the same time, the test is conducted on the solder-wettability thereof, and the results are also indicated in Table 1 below.

(Comparison 2)

With the samples mentioned above, the same processes are applied except that when forming the Ni film as the solder-resistant layer 7 of the external electrodes 5, however, on the solder-resistant layer 7 is formed the layer of the Sn film within the vacuum chamber, which is kept at a temperature of 150° C.

Observing the structure of those external electrodes 5, 5 in the cross-section thereof, through an optical microscope, the Ni—Sn alloy layer is formed on the Ni film as the solder-resistant layer 7.

With those electronic devices, the bonding strength are measured by a peel test, in the similar manner as the example mentioned above, at the same time the test is conducted on the wettability thereof, and the results are also indicated in Table 1 below.

TABLE 1

|  | Example | Comparison 1 | Comparison 2 |
|---|---|---|---|
| Bonding Strength | 2.1 kgf | 0.4 kgf | 1.2 kgf |
| Solder-wettability | good | good | no-good |

As is apparent from the results shown above, with the example, good results can be obtained for both the bonding strength and the solder-wettability. On the other hand, with comparison 1, in which the external electrodes have no intermediate layer, though the solder-wettability upon the surface of the external electrodes is good, the bonding strength is less than ⅕ of the example. Further, with comparison 2, in which the surfaces of the external electrodes are made of a Ni—Sn alloy, the solder wettability is bad. However, the bonding strength is about ½ of the example.

What is claimed is:

1. An electronic device comprising an element assembly made up of electronic parts elements and a metal film external electrode formed on a surface of the element assembly and connected to the electronic parts elements, said external electrode comprising:

an anchor layer adhered to the surface of the element assembly;

a solder-resist layer comprising a first metal provided on said anchor layer;

an intermediate layer formed on said solder-resist layer at a temperature of from 120 to 230° C.; and a solder-wettable layer comprising a second metal formed on said intermediate layer at a temperature of from −100 to 100° C., wherein said intermediate layer contains crystals of an alloy of said first and second metals having a diameter no greater than 1.5 $\mu$m.

2. The electronic device of claim 1, wherein said anchor layer is made of Cr or an alloy containing Cr therein.

3. The electronic device of claim 1, wherein said solder-resistant layer is made of Ni or an alloy containing Ni therein.

4. The electronic device of claim 1, wherein said solder-wettable layer is made of Sn or an alloy containing Sn therein.

5. The electronic device of claim 1, wherein said anchor layer is made of an alloy containing Cr and Ni therein, and said anchor layer is used as said solder-resistant layer.

6. The electronic device of claim 1, wherein the element assembly comprises a plurality of laminated ceramic sheets with internal electrodes provided between adjacent ceramic sheets and said anchor layer is adhered to the surface of a ceramic sheet.

* * * * *